United States Patent
Nikitin

(10) Patent No.: US 6,668,099 B1
(45) Date of Patent: Dec. 23, 2003

(54) METHOD OF MEASURING AN ANGLE OF INCLINATION OF TRAPEZOIDAL MICRO OBJECT SIDE FACES

(75) Inventor: Arkady Nikitin, Moscow (RU)

(73) Assignee: General Phosphorix LLC, Ardsley, NY (US)

( * ) Notice: Subject to any disclaimer, the term of this patent is extended or adjusted under 35 U.S.C. 154(b) by 636 days.

(21) Appl. No.: 09/696,258

(22) Filed: Oct. 26, 2000

(51) Int. Cl.[7] ............................................. G06K 9/36
(52) U.S. Cl. .................................. 382/286; 702/155
(58) Field of Search ............................. 382/286, 174; 348/135, 136; 356/372–387; 700/303; 702/155, 157

(56) References Cited

U.S. PATENT DOCUMENTS 6,331,885 B1 * 12/2001 Nishi ........................... 355/53
6,368,763 B2 * 4/2002 Dirksen et al. ............... 430/30

* cited by examiner

*Primary Examiner*—Yon J. Couso
(74) *Attorney, Agent, or Firm*—I. Zborovsky

(57) ABSTRACT

A method of measuring an angle of inclination of trapezoidal microobject side faces includes positioning an object in a microscope so that a direction along which a scanning of a video signal is to be performed is substantially perpendicular to an orientation of an inclined side face, determining on a video signal two main peaks near edges of an object to be measured which are edge peaks having an asymmetrical shape, in each left and right edge peaks of the video signal using two characteristic points, analyzing a left edge peak and a right edge peak of the video signal, and determining an angle of inclination of a side face, based on the analysis of the left and right edge peaks and the characteristic points of the video signal.

7 Claims, 1 Drawing Sheet a) Geometry of the Lug with Trapeziform Cros-section.
   e⁻ is the Primary Electron Flow or Electron Probe.
   1 is the Sample Scanning Trajectory;
b) the Corresponding Video signal Arising in the SEM a) Geometry of the Lug with Trapeziform Cros-section.
   e' is the Primary Electron Flow or Electron Probe,
   1 is the Sample Scanning Trajectory;
b) the Corresponding Video signal Arising in the SEM.

METHOD OF MEASURING AN ANGLE OF INCLINATION OF TRAPEZOIDAL MICRO OBJECT SIDE FACES

BACKGROUND OF THE INVENTION

The present invention relates to a method of measurements and control of geometrical parameters of microobjects having a trapezoidal shape. It can be used in a microelectronics technology for controlling the results of one of the main technological operations, namely photolithography.

Modern microelectronics technology applies high requirements to the quality of a photoresist mask which is formed by photolithography, as well as electron-beam and x-ray lithography. In particular side faces of the formed shaped elements of resistive mask must be close to vertical as much as possible, so as to guarantee a high reproducability of subsequent processes of chemical, plasma-chemical, ion-beam or another method of etching of technological layers of microcircuit to be formed through the above mentioned photoresist mask. However, in view of various reasons, technically it is not possible to produce details of the photoresist mask with exactly vertical side faces. As a result, the shaped details of the photoresist mask formed in a lithographic process have a typical trapezoidal shape in a cross-section. Conventionally, an angle of inclination of the side face is different from 90° by a few degrees, depending on the type of the used photoresist and the technology of exposure and development of the resistive layer. Special regulations require that by the year 2012 the angle of inclination of the side face of details of the photoresist mask in the microelectronic technology must not be less than 88°. Therefore, the angle of inclination of the side face in the microelectronic industry is a very important parameter to be controlled, in accordance with which sorting out of inadequate microelectronic products at different stages of its manufacture is performed.

It is known to control the geometric shape of the shaped parts formed on a flat surface, including an angle of inclination of the side face of photoresist mask, by direct measurements of the angle on a film of a cross-section of the microelectronic structure obtained in an electron microscope. This method has many disadvantages. First of all the measurement of the angle of inclination of the side face is performed in two steps which are spaced from one another in time and space: preparation of a cross-section and its subsequent measurement by means of a microscope. The first step usually is performed in accordance with a special technology outside of the measuring microscope and is accompanied by an irreversible destruction of the object of measurement. The second step is characterized by a low efficiency, since it is necessary to introduce the prepared cross-section into a microscope chamber and provide, its positioning, focusing of an image, its fixation, and processing for obtaining values of the angle of inclination.

SUMMARY OF THE INVENTION

Accordingly, it is an object of the present invention to provide a method of measuring an angle of inclination of trapezoidal microobject side faces, which avoids the disadvantages of the prior art.

More particularly, it is an object of present invention to provide a method of measuring an angle of inclination of trapezoidal microobject side faces, in accordance with which it is not necessary to destroy an object of measurement during a standard procedure, namely measurement of linear sizes in a scanning electron microscope, with a process performed at the same time and in the same space.

In keeping with these objects and with others which will become apparent hereinafter, one feature of present invention resides, briefly stated, in a method measuring an angle of inclination of trapezoidal microobject side faces, which includes positioning an object in a microscope so that a direction along which a scanning of a video signal is to be performed is substantially perpendicular to an orientation of a n inclined side face, determining on a video signal two main peaks near edges of an object to be measured which are edge peaks having an asymmetrical shape, in each left and right edge peaks of the video signal, analyzing a left edge peak and a right edge peak of the video signal with the use of two spaced points on each edge, and determining an angle of inclination of a side face, based on the analysis of the left and right edge peaks of the video signal.

When the method is performed in accordance with the present invention, it eliminates the disadvantages of the prior art and provides for the above mentioned highly advantageous results.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF PREFERRED EMBODIMENTS

Figure 1:
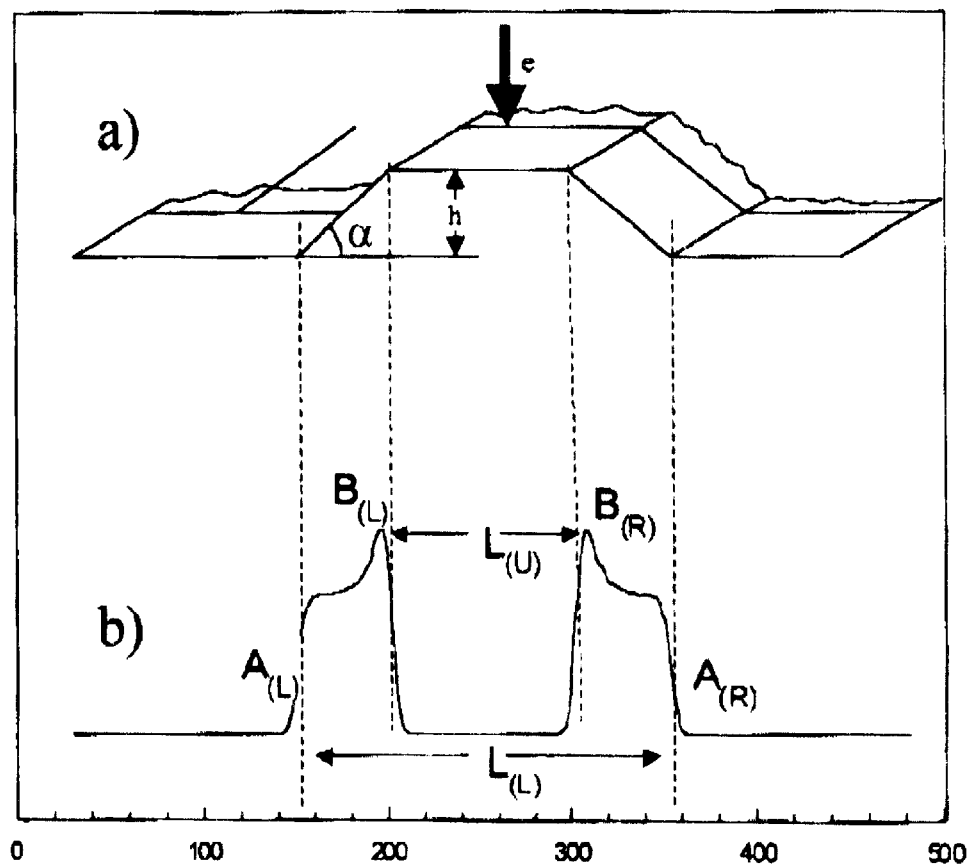
FIG. 1 is a view schematically illustrating a method of measuring an angle of inclination of trapezoidal microobject side faces.

In order to perform a measurement of an angle of inclination of side faces of a trapezoidal microobject, first of all known steps of measurements are performed. In particular, an object of measurement is positioned on a table of a microscope so that a direction along which reading of a video signal is performed, is perpendicular relative to an orientation of the edges of the structure. A magnification of the microscope is selected so that an image of the trapezoidal object to be measured occupies a substantial part of a length of the line of scanning, such as ¼–¾. The image of the object is focused. Then the distribution of values of the video signal is fixed in dependence on a coordinate along the line of scanning, or in other words a "profile" of the video signal, on which two main edge peaks of the video signal are selected, which are localized near the edges of the object to be measured. For a trapezoidal object, these peaks have an asymmetrical shape. In particular, one of the slopes of each peak is a monotonously descending, while the other slope has a pronounced stepped shape.

In accordance with the present invention, on each edge peak of the video signal, namely the left peak L and the right peak R, coordinates X of two characteristic points are fixed, such as point A and point B. The points $A_{LR}$ correspond to the borders of the object in accordance with its lower base and their position corresponds to a maximum of the absolute value of derivative of the video signal on a lower step of the stepped slope. The points $B_{LR}$ correspond to the borders of the object in accordance with its higher base and are located on the apeces of each edge peak.

Then the size of the trapezoidal object is measured line-by-line along its lower base-$L_L$ as a distance along the axis X between the points $A_R$ and $A_L$, divided by the magnification of the microscope:

$$L_L = A_{(R)} - A_{(L)}$$

Then the size of the trapezoidal object is measured along its upper base-$L_U$ line by line as a distance along the axis X between the points $B_R$ and $B_L$, divided by the magnification of the microscope:

$$L_U = B_{(R)} - B_{(L)}$$

The angle of inclination of the side face α for each line is determined in accordance with the following expression:

$$\alpha = \operatorname{arctg}\left[\frac{2h}{L_L - L_U}\right],$$

wherein h is a known height of the trapezoidal object.

In accordance with another embodiment of the present invention, if the side faces of the trapezoidal object do not have an identical angle of inclination, the determination of the angle of inclination is performed in a somewhat different way.

First, an absolute value of a difference δ of X coordinates of the points A and B for each right $\delta_R$ and left $\delta_L$ peak of the video signal is determined $$\delta_R = A_R - B_R$$

$$\delta_L = A_L - B_L.$$

Then angles of inclination for right $\alpha_R$ and left $\alpha_L$ side faces are determined in accordance with the formulas:

$$\alpha_R = \operatorname{arctg}(h/\delta_R)$$

$$\alpha_L = \operatorname{arctg}(h/\delta_L).$$

In accordance with a further feature of the present invention, if the sample is inclined relative to the electron beam, the measurement is performed in a somewhat different way. During a line-by-line mathematical processing of the fixed video signal the following operations are performed:

First a difference $\Delta = L_L - L_U$ is calculated separately for the left $\Delta L$ and the right $\Delta R$ edge of the trapezoidal object, and their values are adapted to the scale of the object with consideration of the magnification of a microscope.

The angle of inclination of the side face a is determined in accordance with the formula:

$$\alpha = \operatorname{arctg}\left[\frac{h^*\cos\beta}{\Delta_L + h^*\sin\beta}\right]$$

when the value AL is utilized, or the formula $$\alpha = \operatorname{arctg}\left[\frac{h^*\cos\beta}{\Delta_R - h^*\sin\beta}\right]$$

when the value ΔR is utilized.

The parameter β is determined by a ratio:

$$\beta = \arcsin\left[\frac{\Delta_R - \Delta_L}{2h}\right]$$

In accordance with the present invention before the determination of the points and their coordinates, a transformation of a real video signal is performed into a reconstructed video signal which corresponds to one obtained with infinitely small probe diameter, or a so-called "function of the sample" for example by deconvolution, since the video signal is usually an inaccurate image of the sample. For this purpose for example a spectrum of the obtained video signal is made by a Fourier transform, then the electron beam is analyzed and a spectrum of the electron beam is formed, thereafter one of the spectra is divided by the other spectra and the results are converted by an inverse Fourier transform. Thereby an idealized video signal is obtained. Thereafter the determination of the points and the measurement of their coordinates are performed on the idealized video signal.

In accordance with a still further feature of the present invention, the fixation of the position of the points where the video signal has a maximal value, in particular the points $B_L$ and $B_R$, is performed in accordance with an analytical curve, which approximates a shape of a apex of an edge maximum in a vicinity of the corresponding point. In other words since there is a substantial noise in the signal in the vicinity of each point, a curve which surrounds approximates the signal in this area is utilized.

In accordance with still a further feature of present invention, before calculation of an angle of inclination in accordance with the formulas presented herein above, the measured values of the sizes Δ, ΔL and ΔR are corrected by introducing a correction +/−1 nanometer. The +1 nanometer is introduced when a measurement of a trapezoidal recess is performed or in other words when the smaller base of the trapeze faces up toward the beam, and −1 nanometer is introduced when the measurement is performed for the trapezoidal trench's bottom projection or in other words when the smaller base of the trapeze faces up toward the beam.

It will be understood that each of the elements described above, or two or more together, may also find a useful application in other types of methods differing from the types described above.

While the invention has been illustrated and described as embodied in method of measuring an angle of inclination of trapezoidal microobject side faces, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is:

1. A method of measuring an angle of inclination of trapezoidal microobject side faces, comprising the steps of positioning an object in a microscope so that a direction along which a scanning of a video signal is to be performed is substantially perpendicular to an orientation of structural edges of structures; determining on a video signal two main peaks near edges of an object to be measured which are edge peaks having an asymmetrical shape; in each left and right edge peaks of the video signal using two characteristic points A and B; analyzing a left edge peak L and a right edge peak R of the video signal; and determining an angle of inclination of a side face, based on the analysis of the left and right edge peaks and the characteristic points of the video signal.

2. A method as defined in claim 1, wherein said analyzing includes fixing on the left L and right R edge peaks of the video signal X coordinates of two characteristic points A and B so the points $A_{L,R}$ correspond to borders of the object at a lower base and their position corresponds to a maximum of an absolute value of a derivative of the video signal at a lower step of a stepped slope, while points $B_{L,R}$ correspond to borders of the object at its upper base and located at apeces of each edge peak, measuring line-by-line a size of a trapezoidal object at its lower base $L_L$ as a distance along an axis X between the points $A_R$, $A_L$ divided by a magnification of the microscope: $L_L = A_{(R)} - A_{(L)}$, measuring line-by-line a size of the trapezoidal object at its lower base LU as a distance along the axis X between the points $B_R$ and $B_L$, divided by the magnification of the microscope $L_U = B_{(R)} - B_{(L)}$, and determining an angle of inclination of a side face α for each line in accordance with the expression:

$$\alpha = \text{arctg}\left[\frac{2h}{[L_L - L_U]}\right],$$

wherein h is a known height of the trapezoidal object.

3. A method as defined in claim 1, wherein said determining includes calculating an absolute value of a difference δ of X coordinates of the points A and B for each right $\delta_R$ and left $\delta_L$ edge peak of the video signal $\delta_R = |A_R - B_R|$ $\delta_L = |A_L - B_L|$ and determining angles of inclination for right $\delta_R$ and left $\delta_L$ side faces in accordance with the formulas:

$\alpha_R = \text{arctg}(h/\delta_R)$ $\alpha_L = \text{arctg}(h/\delta_L)$.

4. A method as defined in claim 1, wherein said determining includes calculating a difference $\Delta\text{-}L_L\text{-}L_U$ separately for each left ΔL and right ΔR edge of the trapezoidal object and adapting the obtained values for a scale of the object with consideration of magnification of the microscope, calculating an angle of inclination of the side face α in accordance with the formula $$\alpha = \text{arctg}\left[\frac{h^*\cos\beta}{\Delta_L + h^*\sin\beta}\right],$$

with the use of the value ΔL, or in accordance with the formula $$\alpha = \text{arctg}\left[\frac{h^*\cos\beta}{\Delta_R - h^*\sin\beta}\right]$$

with the use of the value ΔR, and determining β from the relationship β=arcsin $$\beta = \arcsin\left[\frac{\Delta_R - \Delta_L}{2h}\right].$$

5. A method as defined in claim 1; and further comprising before determining the points, transforming the real video signal into a reconstructs video signals corresponding one obtained with infinitely small probe diameter.

6. A method as defined in claim 1; and further comprising fixing of positions of the points where the video signal has a maximum value in accordance with an analytical curve which approximates a shape of an apex of an edge maximum near a corresponding point.

7. A method as defined in claim 1; and further comprising before calculating an angle of inclination, introducing into corresponding values a correction +/−1 nanometer, with the correction +1 nanometer when measuring a trapezoidal recess, and with the correction −1 nanometer when measuring a trapezoidal projection.

* * * * *